(12) United States Patent
Volkovich et al.

(10) Patent No.: US 11,640,117 B2
(45) Date of Patent: May 2, 2023

(54) SELECTION OF REGIONS OF INTEREST FOR MEASUREMENT OF MISREGISTRATION AND AMELIORATION THEREOF

(71) Applicant: KLA CORPORATION, Milpitas, CA (US)

(72) Inventors: Roie Volkovich, Hadera (IL); Moran Zaberchik, Ahuzat Barak (IL)

(73) Assignee: KLA CORPORATION, Milpitas, CA (US)

(*) Notice: Subject to any disclaimer, the term of this patent is extended or adjusted under 35 U.S.C. 154(b) by 251 days.

(21) Appl. No.: 16/956,209

(22) PCT Filed: May 20, 2020

(86) PCT No.: PCT/US2020/033720
§ 371 (c)(1),
(2) Date: Jun. 19, 2020

(87) PCT Pub. No.: WO2020/263461
PCT Pub. Date: Dec. 30, 2020

(65) Prior Publication Data
US 2021/0364932 A1 Nov. 25, 2021

Related U.S. Application Data
(63) Continuation-in-part of application No. PCT/US2019/047795, filed on Aug. 23, 2019.
(Continued)

(51) Int. Cl.
*G03F 7/20* (2006.01)
*G01N 21/47* (2006.01)
*G01N 21/95* (2006.01)

(52) U.S. Cl.
CPC ......... *G03F 7/70633* (2013.01); *G01N 21/47* (2013.01); *G01N 21/9501* (2013.01); *G03F 7/705* (2013.01)

(58) Field of Classification Search
CPC ............. G01N 21/95607; G01N 21/47; G01N 21/9501; G01N 21/956;
(Continued)

(56) References Cited

U.S. PATENT DOCUMENTS 7,804,994 B2 9/2010 Adel et al.
10,527,951 B2 1/2020 Yohanan et al.
(Continued)

FOREIGN PATENT DOCUMENTS

EP 1570232 A1 9/2005
WO 2012015967 A2 2/2012
(Continued)

OTHER PUBLICATIONS

WIPO, ISR for PCT/US2020/033720, Aug. 26, 2020.
(Continued)

*Primary Examiner* — Steven Whitesell Gordon
(74) *Attorney, Agent, or Firm* — Hodgson Russ LLP

(57) ABSTRACT

A misregistration measurement and region of interest selection system (MMRSS) for measuring misregistration between at least two layers on a wafer in the manufacture of semiconductor devices, the MMRSS including a set of misregistration metrology tools, including at least two misregistration metrology tools, and a misregistration analysis and region of interest selection engine operative to: analyze a plurality of misregistration measurement data sets associated with a set of regions of interest (ROIs) of at least one measurement site on the wafer and at least partially generated by at least one first misregistration metrology tool, and wherein each of the data sets is associated with a set of
(Continued)

quality metrics, identify a recommended ROI and communicate the recommended ROI to at least one second misregistration metrology tool of the set of misregistration metrology tools, the second misregistration metrology tool being operative to generate misregistration metrology data associated with the recommended ROI.

24 Claims, 11 Drawing Sheets

Related U.S. Application Data

(60) Provisional application No. 62/866,185, filed on Jun. 25, 2019.

(58) Field of Classification Search
CPC . G06T 2207/10061; G06T 2207/30148; G03F 7/70616; G03F 7/70633; G03F 7/70625; G03F 7/705
See application file for complete search history.

(56) References Cited

U.S. PATENT DOCUMENTS

| | | |
|---|---|---|
| 2006/0167651 A1 | 7/2006 | Zangooie et al. |
| 2009/0063378 A1 | 3/2009 | Izikson |
| 2012/0069337 A1* | 3/2012 | Ishigo ................. G03F 9/7046 356/401 |
| 2017/0336198 A1 | 11/2017 | Adel et al. |
| 2019/0122357 A1 | 4/2019 | Grunzweig et al. |
| 2021/0223274 A1 | 7/2021 | Milo et al. |

FOREIGN PATENT DOCUMENTS

| | | |
|---|---|---|
| WO | 2020159560 A1 | 8/2020 |
| WO | 2020167331 A1 | 8/2020 |
| WO | 2021054928 A1 | 3/2021 |

OTHER PUBLICATIONS

Ausschnitt et al., Multilayer Overlay Metrology, Proceedings of SPIE, vol. 6152, Metrology, Inspection, and Process Control for Microlithography, Mar. 24, 2006.

* cited by examiner

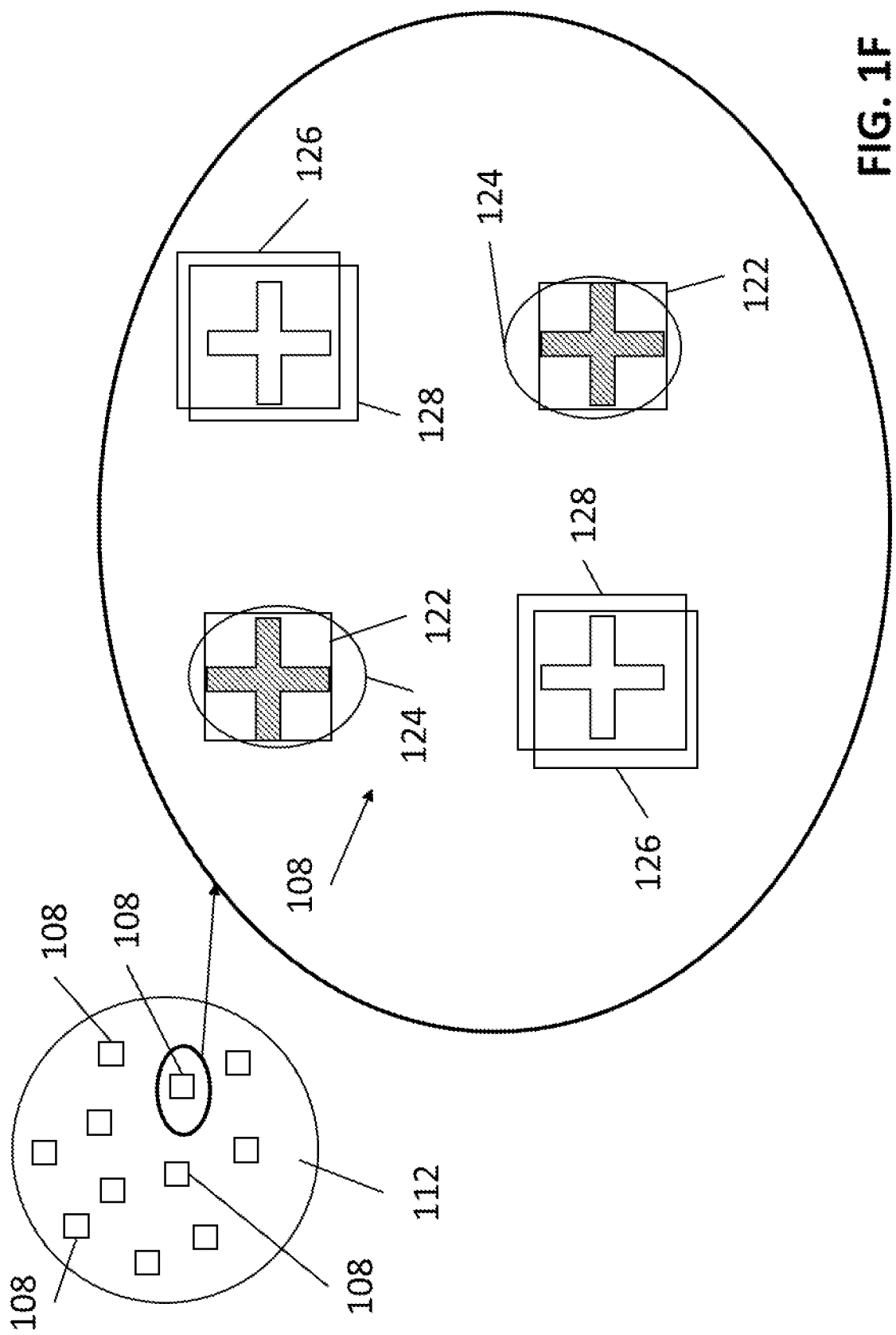

SELECTION OF REGIONS OF INTEREST FOR MEASUREMENT OF MISREGISTRATION AND AMELIORATION THEREOF

REFERENCE TO RELATED APPLICATIONS

Reference is hereby made to U.S. Provisional Patent Application Ser. No. 62/866,185, filed Jun. 25, 2019 and entitled REGION OF INTEREST (ROI) OPTIMIZATION FOR MATCHING and to PCT Application No. PCT/US2019/047795, filed Aug. 23, 2019 and entitled MULTIPLE-TOOL PARAMETER SET CONFIGURATION AND MISREGISTRATION MEASUREMENT SYSTEM AND METHOD, the disclosures of which are hereby incorporated by reference and priority of which is hereby claimed.

Reference is also made to the following patents and patent applications of the Applicant, which are related to the subject matter of the present application, the disclosures of which are hereby incorporated by reference:

U.S. Pat. No. 7,804,994 entitled OVERLAY METROLOGY AND CONTROL METHOD;

U.S. Pat. No. 10,527,951 entitled COMPOUND IMAGING METROLOGY TARGETS;

European Patent No. 1,570,232 entitled APPARATUS AND METHODS FOR DETECTING OVERLAY ERRORS USING SCATTEROMETRY;

PCT Patent Application No. PCT/US2019/026686, filed Apr. 10, 2019 and entitled MOIRÉ TARGET AND METHOD FOR USING THE SAME IN MEASURING MISREGISTRATION OF SEMICONDUCTOR DEVICES;

PCT Application No. PCT/US2019/035282, filed Jun. 4, 2019 and entitled MISREGISTRATION MEASUREMENTS USING COMBINED OPTICAL AND ELECTRON BEAM TECHNOLOGY;

PCT Patent Application No. PCT/US2019/051209, filed Sep. 16, 2019 and entitled PERIODIC SEMICONDUCTOR DEVICE MISREGISTRATION METROLOGY SYSTEM AND METHOD; and U.S. patent application Ser. No. 16/747,734, filed Jan. 21, 2020 and entitled SYSTEM AND METHOD FOR ANALYZING A SAMPLE WITH A DYNAMIC RECIPE BASED ON ITERATIVE EXPERIMENTATION AND FEEDBACK.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a misregistration measurement and region of interest selection system (MMRSS) for measuring misregistration between at least two layers formed on a wafer in the manufacture of semiconductor devices, the MMRSS including a set of misregistration metrology tools, including at least two misregistration metrology tools, and a misregistration analysis and region of interest selection engine (MARSE) operative to analyze a plurality of misregistration measurement data sets associated with a set of regions of interest (ROIs) of at least one measurement site on the wafer and at least partially generated by at least one first misregistration metrology tool of the set of misregistration metrology tools, the set of ROIs including at least two ROIs, and wherein each of the misregistration measurement data sets associated with the set of ROIs is associated with a set of quality metrics, identify a recommended region of interest (ROI) from the set of ROIs, and communicate the recommended ROI to at least one second misregistration metrology tool of the set of misregistration metrology tools, the at least one second misregistration metrology tool and the at least one first misregistration metrology tool being separate tools and the second misregistration metrology tool being operative to generate misregistration metrology data associated with the recommended ROI.

In accordance with a preferred embodiment of the present invention, the at least two misregistration metrology tools are imaging misregistration metrology tools. Alternatively, in accordance with a preferred embodiment of the present invention, the at least two misregistration metrology tools are electron beam misregistration metrology tools. Preferably, the set of quality metrics include at least one of accuracy flags, a tool induced shift (TIS), a Qmerit, a focus sensitivity, a throughput, a precision, a sensitivity to ROI placement, and a contrast precision.

Alternatively, in accordance with a preferred embodiment of the present invention, the at least two misregistration metrology tools are scatterometry misregistration metrology tools. Preferably, the set of quality metrics include at least one of accuracy flags, a tool induced shift (TIS), a Qmerit, a focus sensitivity, a throughput, a precision, a sensitivity to ROI placement, and a pupil 3σ.

Preferably, the recommended ROI is identified based on the set of quality metrics.

In accordance with a preferred embodiment of the present invention, the at least one first misregistration metrology tool includes a single misregistration metrology tool of the set of misregistration metrology tools. Alternatively, in accordance with a preferred embodiment of the present invention, the at least one first misregistration metrology tool includes multiple misregistration metrology tools of the set of misregistration metrology tools.

In accordance with a preferred embodiment of the present invention, the set of ROIs includes 100 ROIs. In accordance with a preferred embodiment of the present invention, the ROIs are measured separately by the at least one first misregistration metrology tool. Preferably, the set of ROIs is measured multiple times by the at least one first misregistration metrology tool. Alternatively, in accordance with a preferred embodiment of the present invention, the ROIs in the set of ROIs are measured by each of the at least one first misregistration metrology tools in a single measurement. Preferably, the MARSE is operative to identify the plurality of misregistration measurement data sets from data generated by the single measurement.

Preferably, the MARSE is further operative to communicate the recommended ROY to the at least one first misregistration metrology tool. Preferably, the MMRSS is operative to be useful in at least one of a set of automatic recipe optimization (ARO) protocols, a set of standalone optimization protocols and a set of automatic recipe training protocols.

There is also provided in accordance with another preferred embodiment of the present invention a region of interest selection method (RSM) for measuring misregistration between at least two layers formed on a wafer in the manufacture of semiconductor devices, the RSM including generating a plurality of misregistration measurement data sets associated with a set of regions of interest (ROIs) of at least one measurement site on the wafer using at least one first misregistration metrology tool of a set of misregistration metrology tools, the set of ROIs including at least two ROIs, and wherein each of the misregistration measurement data sets associated with the set of ROIs is associated with a set of quality metrics, identifying a recommended ROI from the set of ROIs, communicating the recommended ROI to at least one second misregistration metrology tool of the set of misregistration metrology tools, the at least one second misregistration metrology tool and the at least one first misregistration metrology tool being separate tools and generating misregistration metrology data associated with the recommended ROI using the at least one second misregistration metrology tool.

BRIEF DESCRIPTION OF THE DRAWINGS

The present invention will be understood and appreciated more fully from the following detailed description, taken in conjunction with the drawings in which:

FIGS. 1B, 1C, 1D, 1E, 1F, 1G, 1H and 1I are each an enlargement corresponding to enlargement circle B of FIG. 1A, showing a simplified top planar illustration of a respective embodiment of a wafer having a plurality of exemplary regions of interest that may be selected by the MMRSS of FIG. 1A.

DETAILED DESCRIPTION OF PREFERRED EMBODIMENTS

It is appreciated that the system and method described hereinbelow with reference to FIGS. 1A-2B are used to measure misregistration between layers of semiconductor devices and form part of a manufacturing process for semiconductor devices. The misregistration measured by the system and method described hereinbelow with reference to FIGS. 1A-2B is used to adjust fabrication processes, such as lithography, during the manufacturing of semiconductor devices, to ameliorate misregistration between various layers of the semiconductor devices being fabricated.

Figure 1A:
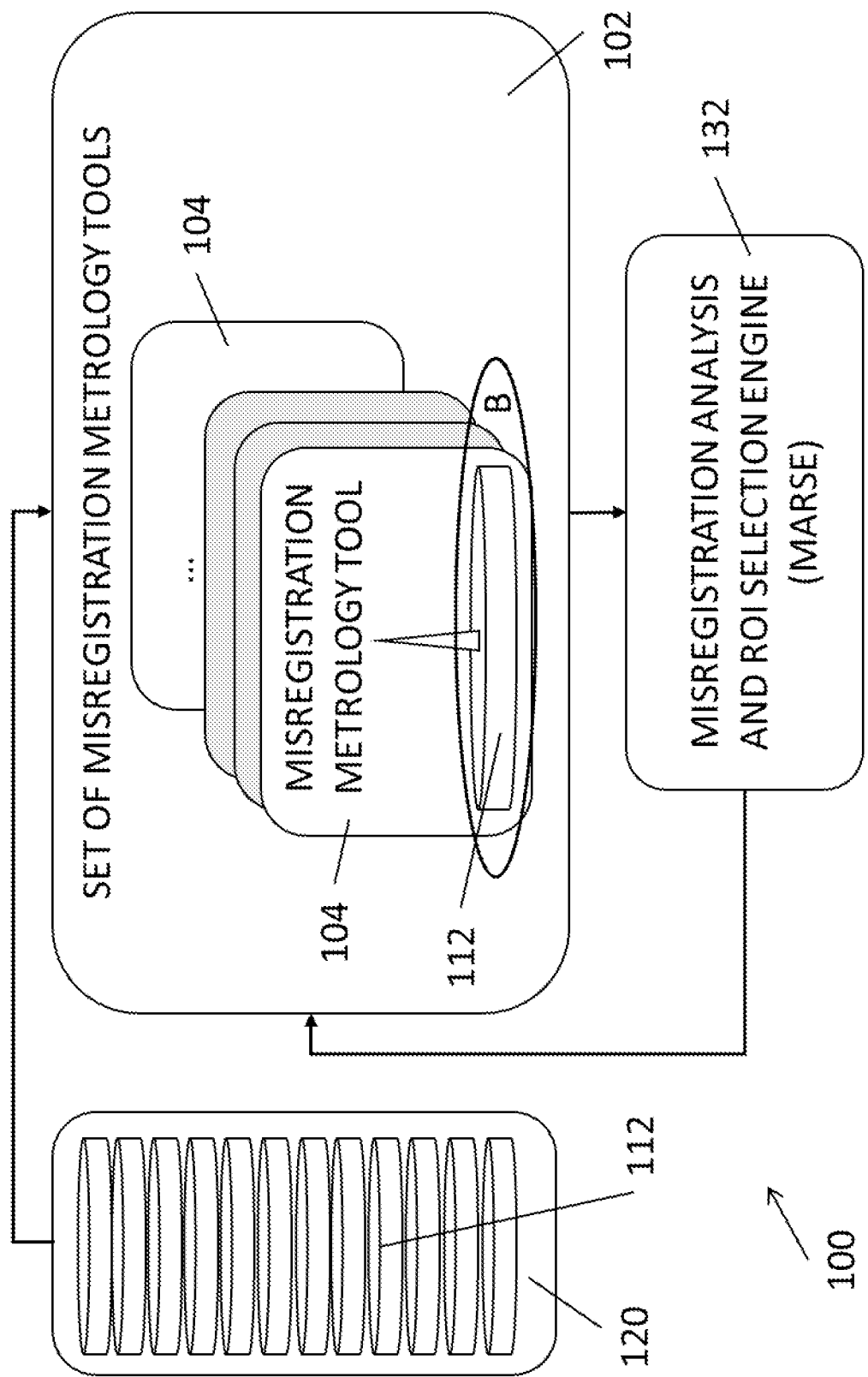
FIG. 1A is a simplified schematic illustration of a misregistration measurement and region of interest selection system (MMRSS) of the present invention.

Reference is now made to FIG. 1A, which is a simplified schematic illustration of a misregistration measurement and region of interest selection system (MMRSS) 100 of the present invention. Reference is additionally made to FIGS. 1B-1I, each of which is an enlargement, corresponding to enlargement circle B of FIG. 1A, showing a simplified top planar illustration of a respective embodiment of a wafer having a plurality of exemplary regions of interest that may be selected by MMRSS 100. It is appreciated that, for ease of understanding, FIGS. 1A-1I are not drawn to scale. It is further appreciated that in a preferred embodiment of the present invention, at least some of the features shown in FIGS. 1B-1I may be, and typically are, formed on separate layers of a wafer, and at least some features shown in FIGS. 1B-1I may be, and typically are, covered by other structures also formed on the wafer.

MMRSS 100 preferably measures misregistration between at least two layers of a semiconductor device wafer at one or more measurement sites. It is a particular feature of MMRSS 100 that MMRSS 100 preferably selects a recommended region of interest (ROI) at each measurement site. The recommended ROI may include the entire measurement site or a particular portion thereof.

As seen particularly in FIG. 1A, MMRSS 100 includes a set of misregistration metrology tools 102, including two or more misregistration metrology tools 104. At least one misregistration metrology tool 104 generates a plurality of misregistration measurement data sets associated with a set of ROIs 106, as is described hereinbelow with reference to FIGS. 1B-1I.

The misregistration measurement data is generated by MMRSS 100 by measuring, preferably at multiple measurement sites 108 thereon, misregistration between at least two layers formed on a wafer 112. Wafer 112 preferably includes a plurality of semiconductor devices and is selected from a batch of wafers 120.

In one embodiment of the present invention, each of wafers 112 in batch of wafers 120 undergoes the same fabrication steps and include semiconductor devices which are intended to be identical to corresponding semiconductor devices on all other wafers 112 in batch of wafers 120.

In another embodiment of the present invention, at least one wafer 112 in batch of wafers 120 is intentionally fabricated differently than other wafers 112 in batch of wafers 120, typically as a design of experiment (DOE) wafer, which is fabricated using parameters that intentionally vary from other wafers 112 in batch of wafers 120.

In one embodiment of the present invention, each of the various misregistration metrology tools 104 of set of misregistration metrology tools 102 measures misregistration between at least two different layers formed on the same wafer 112. In another embodiment of the present invention, each of the various misregistration metrology tools 104 of set of misregistration metrology tools 102 measures misregistration between at least two different layers formed on two different wafers 112 selected from batch of wafers 120.

Misregistration metrology tools 104 of set of misregistration metrology tools 102 may be any suitable misregistration metrology tools. Preferably, all misregistration metrology tools 104 in set of misregistration metrology tools 102 belong to a single category of misregistration metrology tools. Examples of categories of misregistration metrology tools include, inter alia, scatterometry misregistration metrology tools, imaging misregistration metrology tools and electron beam misregistration metrology tools.

A typical scatterometry misregistration metrology tool useful as misregistration metrology tool 104 is an ATL™ 100, commercially available from KLA Corporation of Milpitas, Calif., USA. A typical imaging misregistration metrology tool useful as misregistration metrology tool 104 is an Archer™ 750, commercially available from KLA Corporation of Milpitas, Calif., USA. A typical electron beam misregistration metrology tool useful as misregistration metrology tool 104 is an eDR7380™, commercially available from KLA Corporation of Milpitas, Calif., USA.

It is noted that while all misregistration metrology tools 104 of set of misregistration metrology tools 102 preferably belong to a single category of misregistration metrology tools, each of misregistration metrology tools 104 of set of misregistration metrology tools 102 need not be the same model of misregistration metrology tool.

For example, in an embodiment wherein misregistration metrology tools 104 belong to the imaging misregistration metrology tool category, one misregistration metrology tool 104 may be an Archer™ 750 and another misregistration metrology tool 104 may be an Archer™ 600 or any other suitable imaging misregistration metrology tool.

Similarly, in an embodiment wherein misregistration metrology tools 104 belong to the scatterometry misregistration metrology tool category, one misregistration metrology tool 104 may be an ATL™ 100 and another misregistration metrology tool 104 may be an ATL™ 150 or any other suitable scatterometry misregistration metrology tool.

Similarly, in an embodiment wherein misregistration metrology tools 104 belong to the electron beam misregistration metrology tool category, one misregistration metrology tool 104 may be an eDR7380™ and another misregistration metrology tool 104 may be an eDR7280™ or any other suitable electron beam misregistration metrology tool.

It is appreciated that set of misregistration metrology tools 102 may include more than two misregistration metrology tools 104. Preferably all misregistration metrology tools 104 in set of misregistration metrology tools 102 belong to the same category, for example, all scatterometry misregistration metrology tools, all imaging misregistration metrology tools or all electron beam misregistration metrology tools.

As seen particularly in FIGS. 1B-1I, wafer 112 preferably includes multiple measurement sites 108. Each of the multiple measurement sites 108 may be any suitable size or shape. However, measurement sites 108 useful in the present invention are typically 0.1 µm²-1000 µm², and more typically 1 µm²-100 µm². Similarly, measurement sites 108 may be located at any suitable location on wafer 112, such as in a scribe line or in a die. In a preferred embodiment of the present invention, each of measurement sites 108 is particularly designed for misregistration measurement between layers of interest on wafer 112 by misregistration metrology tool 104.

For example, if misregistration metrology tool 104 is an imaging misregistration metrology tool, each of measurement sites 108 preferably includes an assortment of features that together form an imaging target, which provides an indication of misregistration between at least two layers formed on wafer 112 upon measurement by the imaging misregistration metrology tool. Such a target may be embodied as, inter alia: a Moiré target, such as a target shown in FIG. 1B, which is similar to targets described in PCT Patent Application No. PCT/US2019/026686, filed Apr. 10, 2019 and entitled MOIRÉ TARGET AND METHOD FOR USING THE SAME IN MEASURING MISREGISTRATION OF SEMICONDUCTOR DEVICES; an advanced imaging metrology (AIM) target, such as a target shown in FIG. 1C, which is similar to targets described in U.S. Pat. No. 10,527,951 and entitled COMPOUND IMAGING METROLOGY TARGETS; a box-in-box target, such as a target shown in FIG. 1D, which is similar to targets described in U.S. Pat. No. 7,804,994 and entitled OVERLAY METROLOGY AND CONTROL METHOD; an AIM in-device (AIMid) target, such as a target shown in FIG. 1E, which is similar to targets described in U.S. Pat. No. 10,527,951 and entitled COMPOUND IMAGING METROLOGY TARGETS; or a micro-blossom target, such as a target shown in FIG. 1F, which is similar to targets described in C. P. Ausschnitt, J. Morningstar, W. Muth, J. Schneider, R. J. Yerdon, L. A. Binns, N. P. Smith, "Multi-layer overlay metrology." Proc. SPIE 6152, Metrology, Inspection, and Process Control for Microlithography XX, 615210 (24 Mar. 2006).

Similarly, if misregistration metrology tool 104 is a scatterometry misregistration metrology tool, each of measurement sites 108 preferably includes an assortment of features that together form a scatterometry target, which provides an indication of misregistration between at least two layers formed on wafer 112 upon measurement by the scattering misregistration metrology tool. Such a target may be embodied as, inter alia, a target such as is shown in FIG. 1G, which is similar to targets described in European Patent No. 1,570,232, entitled APPARATUS AND METHODS FOR DETECTING OVERLAY ERRORS USING SCATTEROMETRY.

Similarly, if misregistration metrology tool 104 is an electron beam misregistration metrology tool, each of measurement sites 108 preferably includes an assortment of features that together form an electron beam target, which provides an indication of misregistration between at least two layers formed on wafer 112 upon imaging by an electron beam misregistration metrology tool. Such a target may be embodied as, inter alia, a target such as is shown in FIG. 1H, which is similar to targets described in PCT Application No. PCT/US2019/035282, filed Jun. 4, 2019 and entitled MISREGISTRATION MEASUREMENTS USING COMBINED OPTICAL AND ELECTRON BEAM TECHNOLOGY.

In another embodiment of the present invention, each of measurement sites 108 preferably includes complete or partial semiconductor devices whose misregistration is measured directly by misregistration metrology tool 104. By way of example only, misregistration metrology tool 104 may directly measure a semiconductor device such as is shown in FIG. 1I, which is similar to that described in PCT Patent Application No. PCT/US2019/051209, filed Sep. 16, 2019 and entitled PERIODIC SEMICONDUCTOR DEVICE MISREGISTRATION METROLOGY SYSTEM AND METHOD.

It is appreciated that in all embodiments of the present invention, misregistration may be measured between any number of layers formed on wafer 112, as long as a suitable assortment of features is chosen. It is further appreciated that the features included in measurement site 108 may be present in all of measurement site 108 or any portion thereof.

Figure 1B:
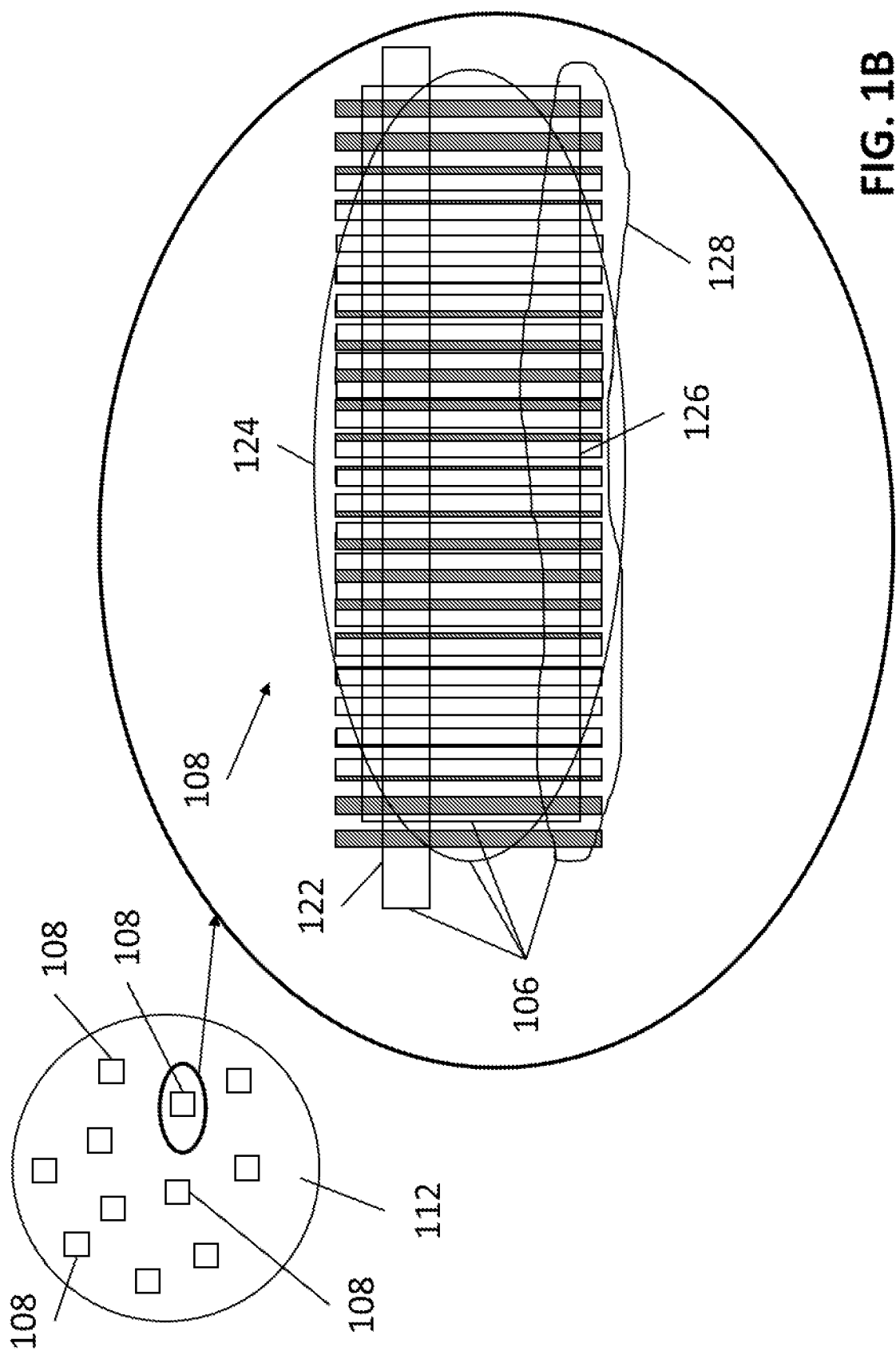
Figure 1C:
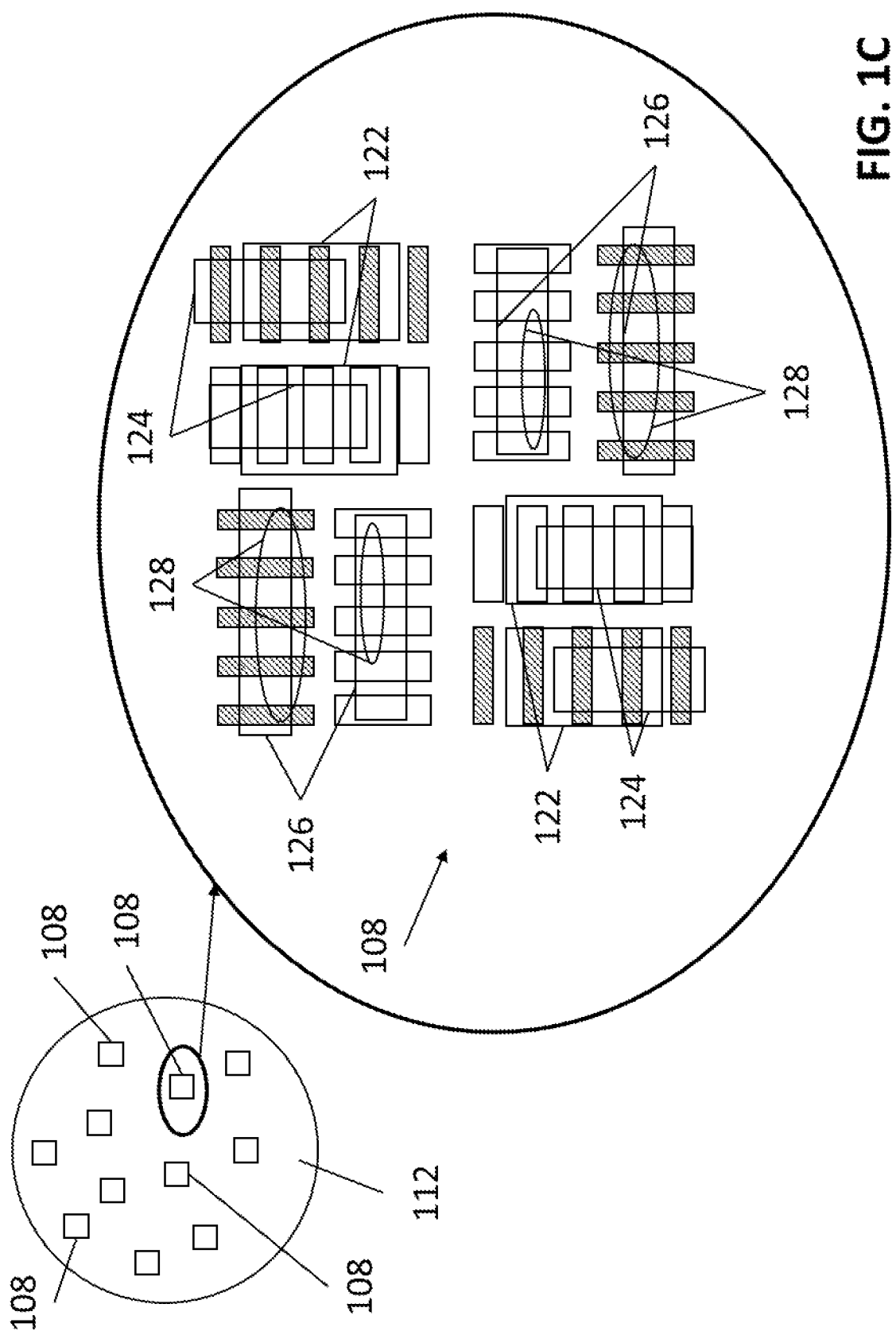
Figure 1D:
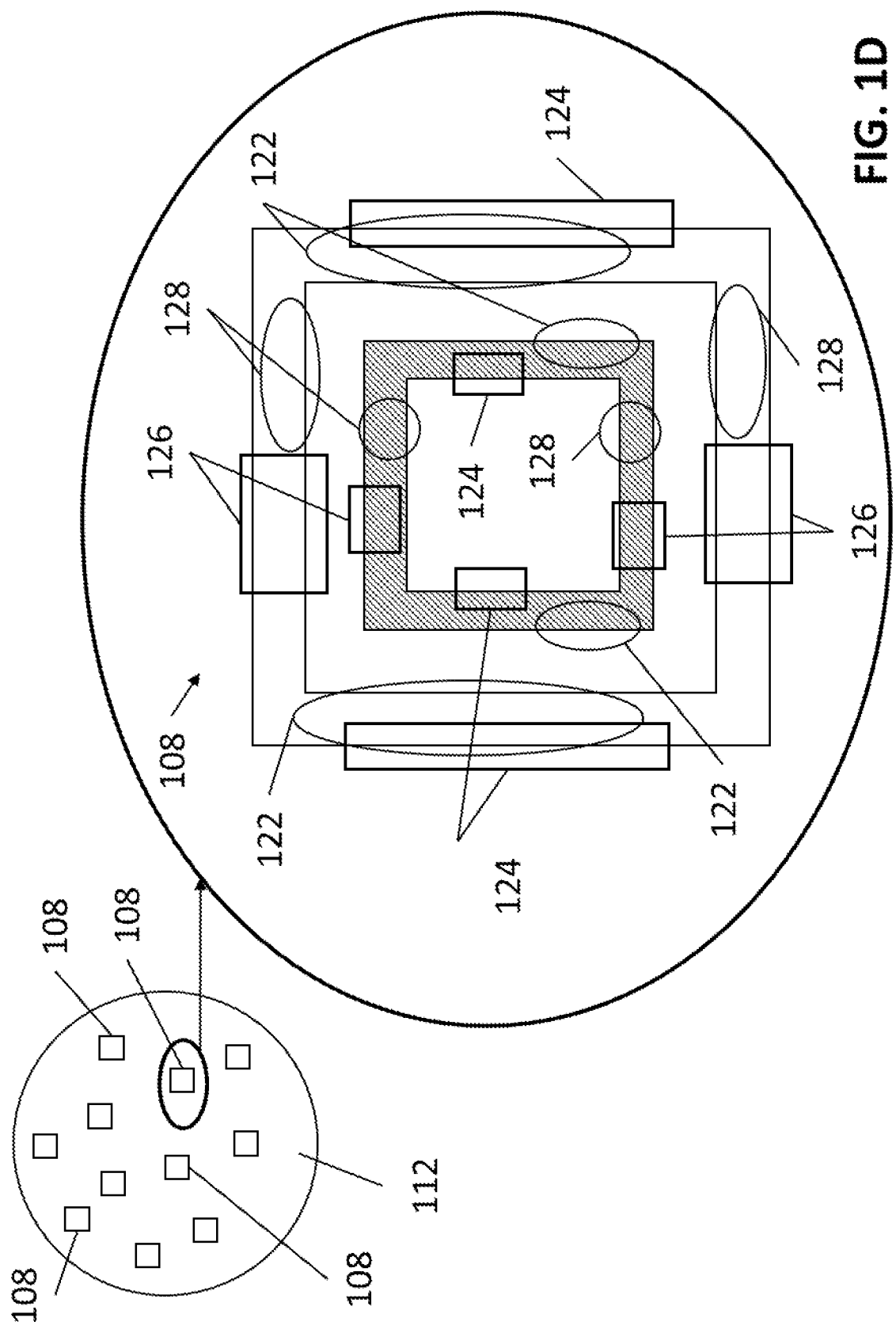
Figure 1E:
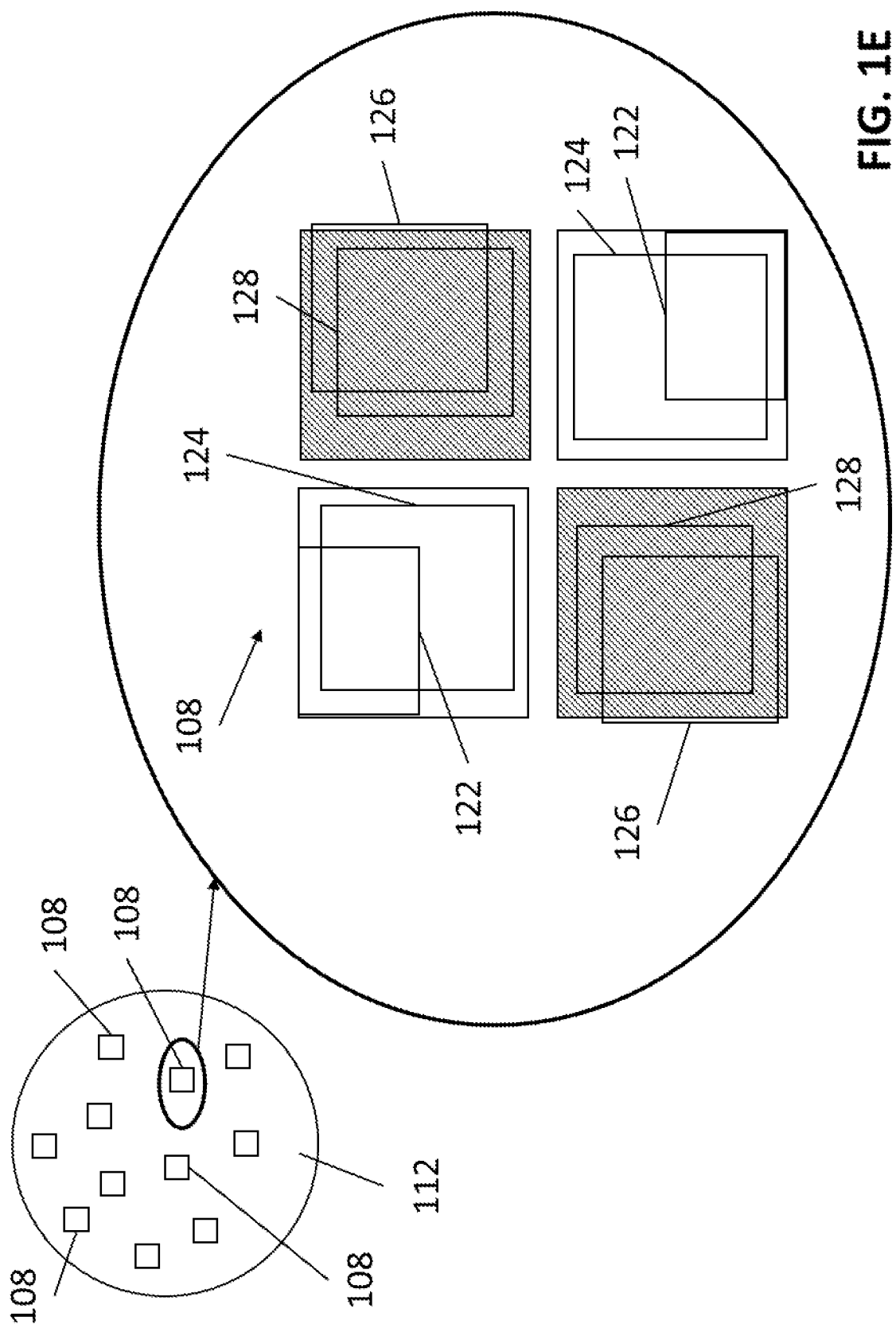
Figure 1G:
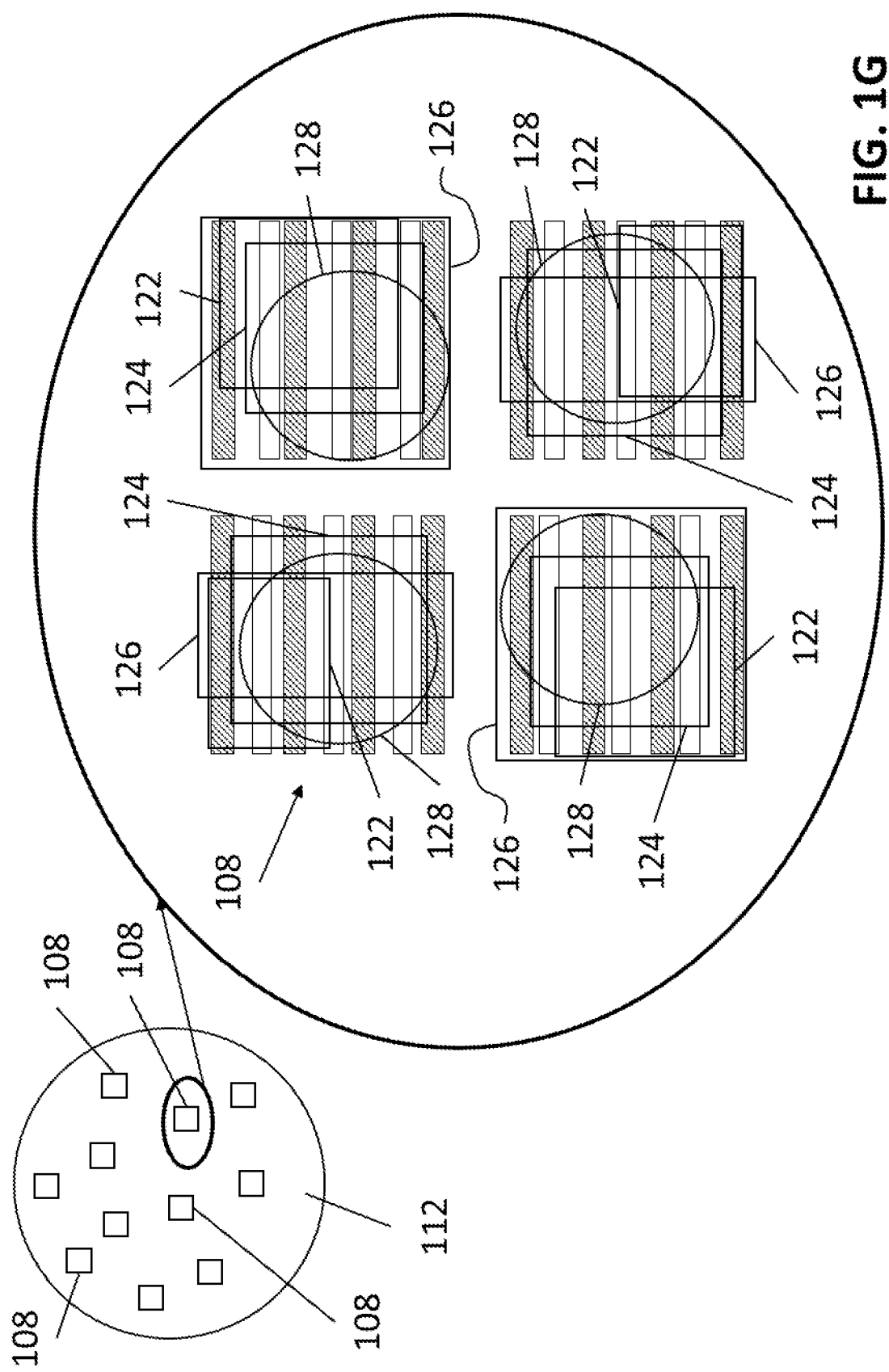
Figure 1H:
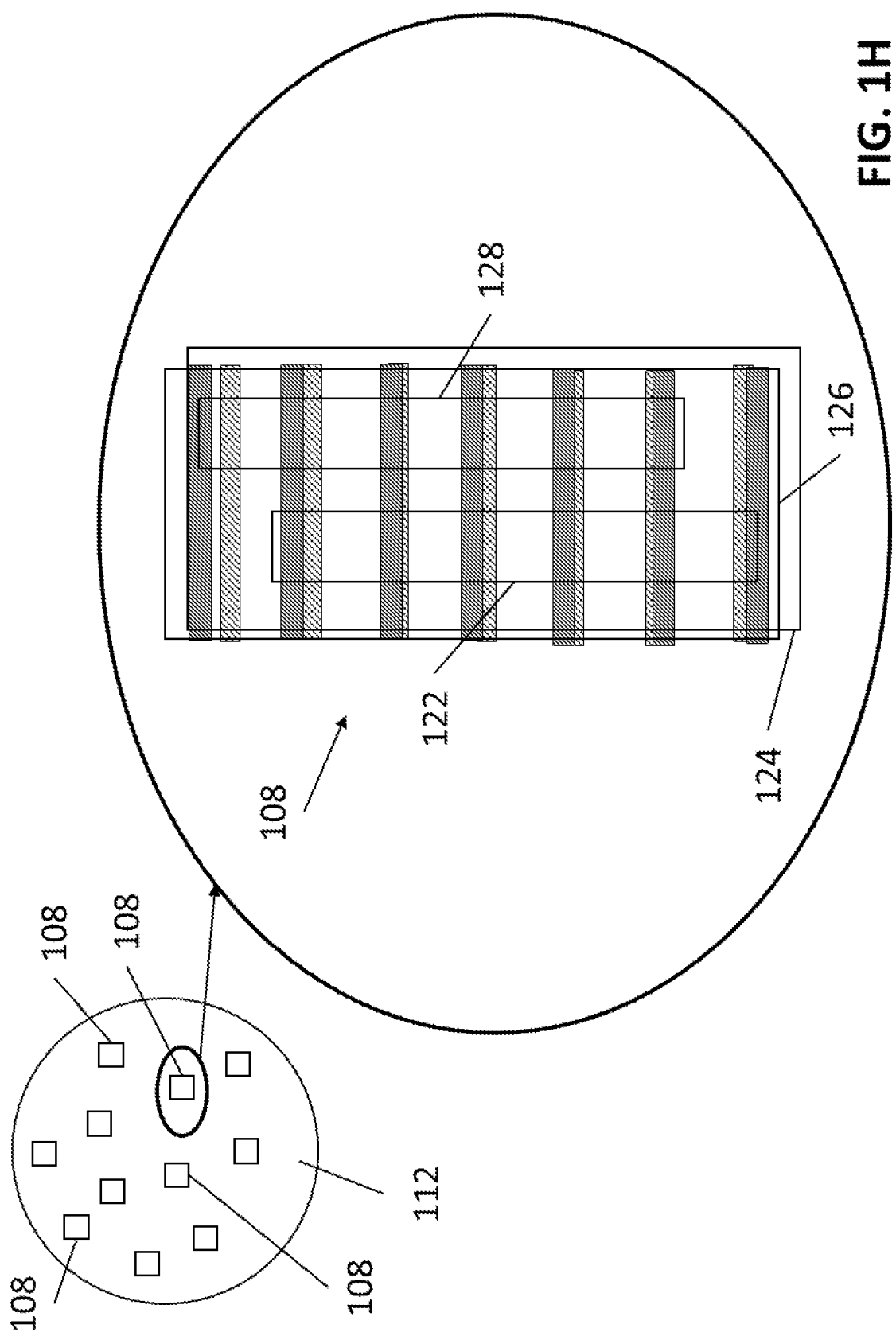
Figure 1I:
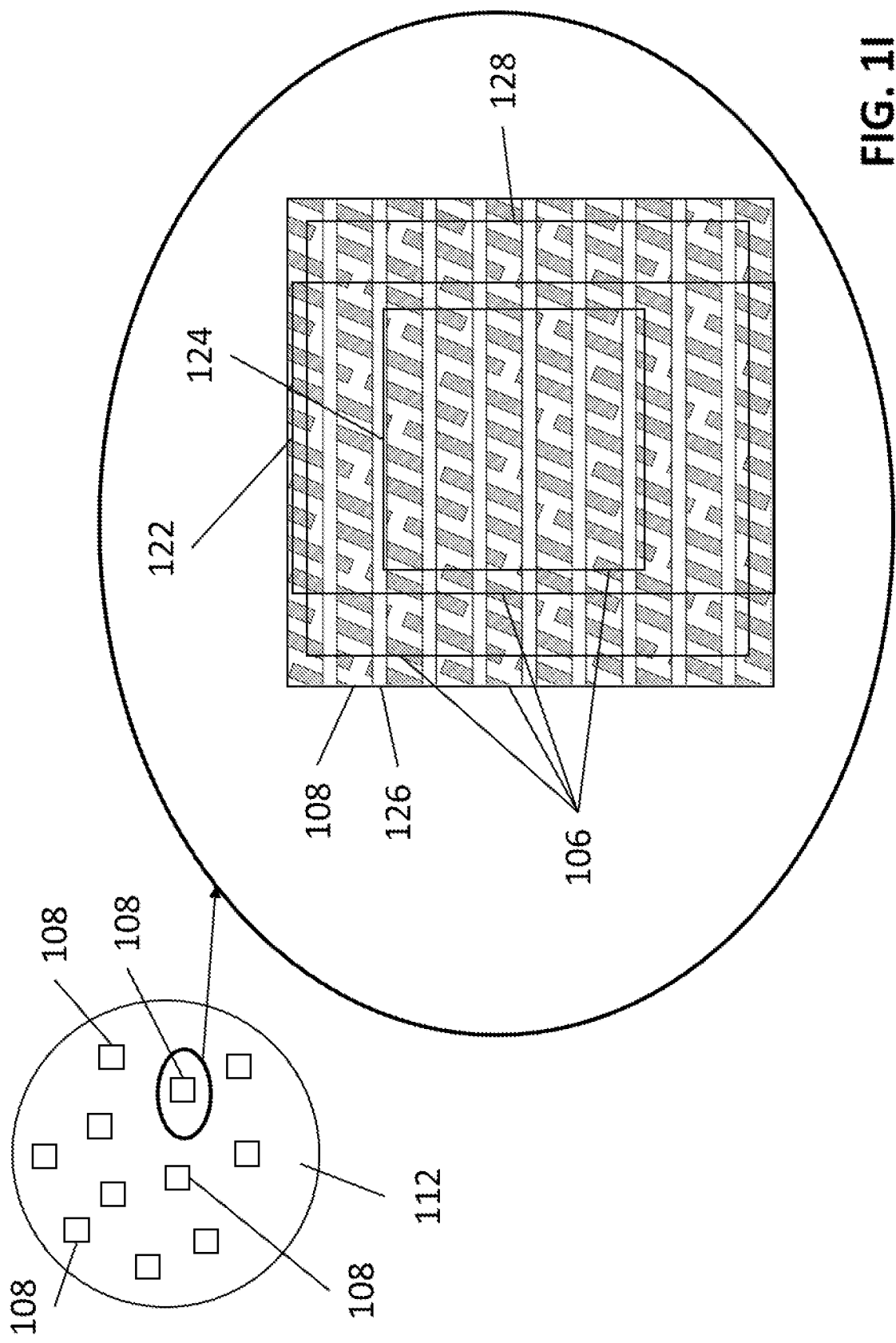

In all embodiments of the present invention, as seen in FIGS. 1B-1I, measurement site 108 includes a set of ROIs 106. Set of ROIs 106 includes at least one ROI 122, and more preferably, a plurality of ROIs 122, 124, 126 and 128. It is appreciated that although, for simplicity, the present invention is described in terms of four ROIs 122, 124, 126 and 128 that are shown in FIGS. 1B-1, set of ROIs 106 preferably includes 2-100 ROIs, and whenever ROIs 122, 124, 126 and 128 are referred to hereinbelow, the intention is to refer to each ROI included in set of ROIs 106.

Each ROI 122, 124, 126 and 128 is a region of measurement site 108 that is considered when measuring or analyzing measurement site 108 with MMRSS 100. It is appreciated that for ease of understanding, a solid line is used in FIGS. 1B-1I to indicate the boundaries of each of ROIs 122, 124, 126 and 128; however, ROIs 122, 124, 126 and 128 do not typically include any such physical indication.

It is appreciated that the area of any ROI 122, 124, 126 or 128 may be smaller than, larger than or the same size as the area of features included in measurement site 108. Similarly, each ROI 122, 124, 126 and 128 may be located at any suitable location within measurement site 108, such as in the center of measurement site 108 or closer to an edge of measurement site 108.

Additionally, each ROI 122, 124, 126 and 128 may be contiguous, as seen particularly in FIGS. 1B, 1H and 1I, or non-contiguous, as seen particularly in FIGS. 1C, ID, IE, IF and IG. Regardless of whether each ROI 122, 124, 126 and 128 is contiguous or non-contiguous, each ROI 122, 124, 126 and 128 may be symmetric or asymmetric with respect to itself, with respect to measurement site 108 or with respect to features within measurement site 108.

In one embodiment of the present invention, each of ROIs 122, 124, 126 and 128 in set of ROIs 106 is measured separately by a single misregistration metrology tool 104. In another embodiment of the present invention, each of ROIs 122, 124, 126 and 128 in set of ROIs 106 is measured separately by different misregistration metrology tools 104 of set of misregistration metrology tools 102. In yet another embodiment of the present invention, one or more misregistration metrology tools 104 measure the entirety of measurement site 108 in each measurement, and individual ROIs 122, 124, 126 and 128 are selected for analysis following the measurement of measurement site 108.

Upon measurement of set of ROIs 106 by at least one misregistration metrology tool 104, a misregistration measurement data set is generated for each ROI 122, 124, 126 and 128 in set of ROIs 106. Thus, set of ROIs 106 has associated with it a plurality of misregistration measurement data sets generated by one or more misregistration metrology tools 104.

As seen in FIG. 1A, MMRSS 100 further includes a misregistration analysis and ROI selection engine (MARSE) 132. Preferably, in the embodiment of the present invention wherein one or more misregistration metrology tools 104 measures the entirety of measurement site 108, individual ROIs 122, 124, 126 and 128 are selected for analysis by MARSE 132 following the measurement of measurement site 108.

In a preferred embodiment of the present invention, MARSE 132 evaluates a set of quality metrics associated with the misregistration measurement data sets generated by misregistration metrology tool or tools 104. The set of quality metrics may include, inter alia, accuracy flags, tool induced shift (TIS), Qmerit, focus sensitivity, throughput, precision and sensitivity to ROI placement. The sensitivity to ROI placement quality metric provides an indication of how misregistration measurement data and quality metrics of misregistration change for different ones of ROIs 122, 124, 126 and 128 of set of ROIs 106.

If misregistration metrology tool 104 is embodied as an imaging misregistration metrology tool or an electron beam misregistration metrology tool, the set of quality metrics may also include, for example, contrast precision. If misregistration metrology tool 104 is embodied as a scatterometry misregistration metrology tool, the set of quality metrics may also include, for example, pupil 3σ and any additional suitable pupil data quality metrics. The quality metrics of each misregistration measurement data set are compared to each other, and any of ROIs 122, 124, 126 or 128 associated with a misregistration measurement data set associated with a particularly desirable set of quality metrics is identified by MARSE 132 as a recommended ROI.

Preferably, MARSE 132 communicates the recommended ROI to the misregistration metrology tool 104 that generated the misregistration measurement data used by MARSE 132 to select the recommended ROT. Preferably, MARSE 132 further communicates the recommended ROI to at least one additional misregistration metrology tool 104 of set of misregistration metrology tools 102 that generated the misregistration measurement data used by MARSE 132 to select the recommended ROI.

Figure 2A:
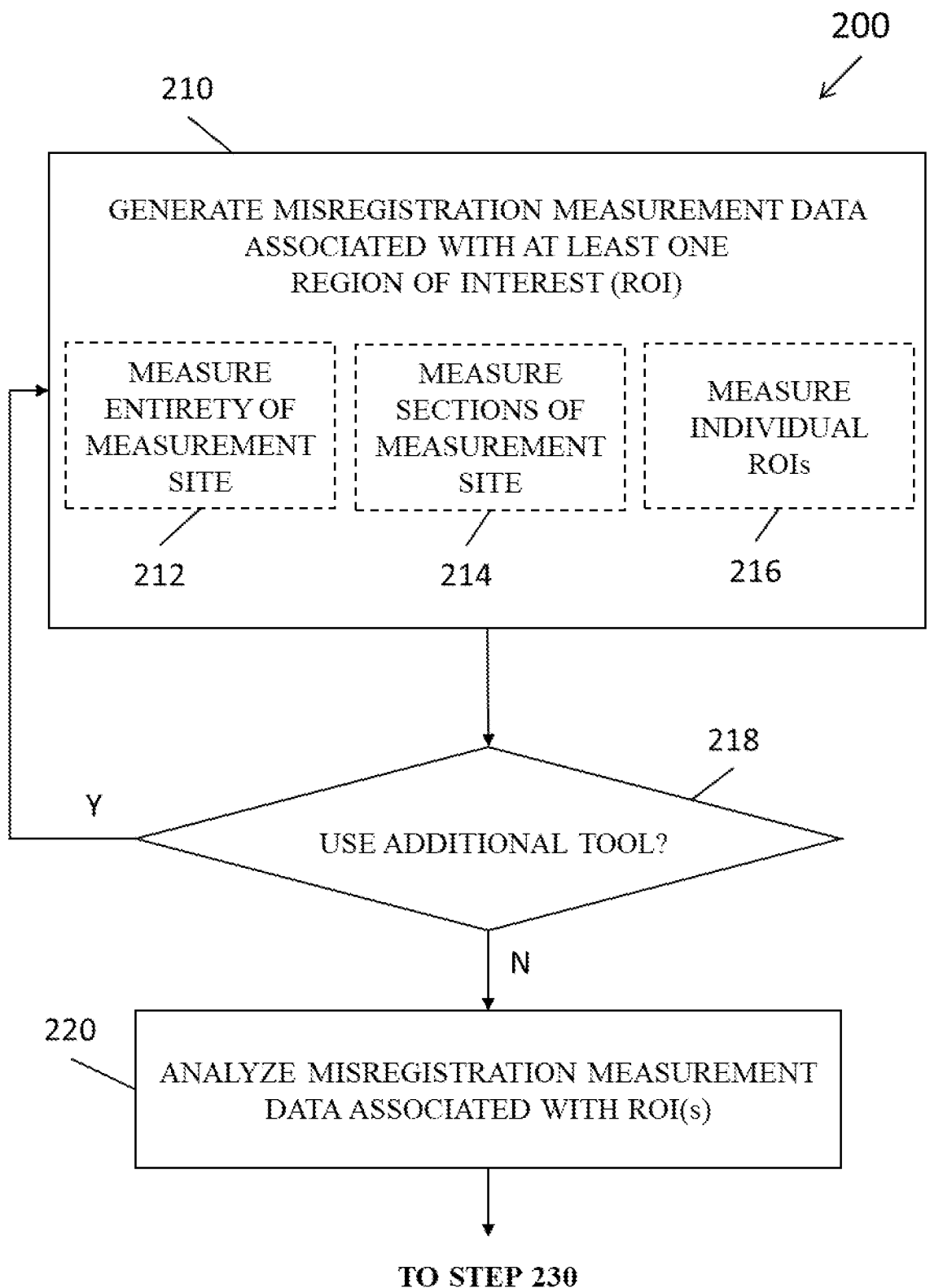
FIGS. 2A and 2B together are a simplified flowchart illustrating a region of interest selection method for use with the MMRSS of FIGS. 1A-1I.
Figure 2B:
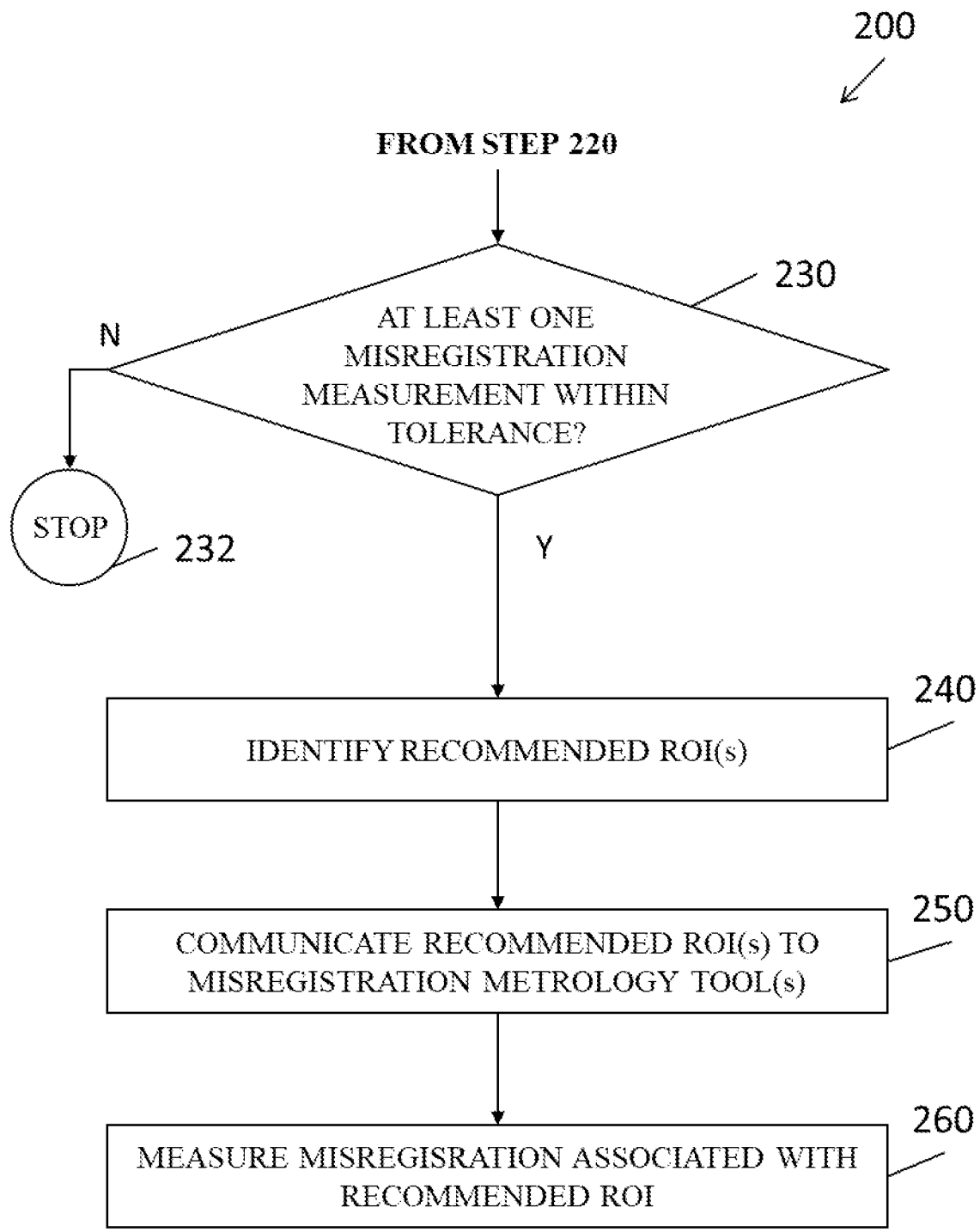

Reference is now made to FIGS. 2A-2B, which together are a simplified flowchart illustrating an ROI selection method (RSM) 200 for use with MMRSS 100. As seen at a first step 210, at least one ROI 122, 124, 126 or 128 at measurement site 108 on wafer 112 is measured by a misregistration metrology tool 104, thereby generating misregistration measurement data associated with at least one ROI 122, 124, 126 or 128. In some embodiments of the present invention, step 210 is performed multiple times, at least once for each of measurement sites 108, thereby generating misregistration measurement data associated with at least one ROT 122, 124, 126 or 128 at a plurality of measurement sites 108.

In one embodiment of step 210, as seen at step 212, misregistration metrology tool 104 measures the entirety of measurement site 108, generating misregistration metrology data associated therewith. Preferably, in such an embodiment, ROIs 122, 124, 126 and 128 in set of ROIs 106 are measured by misregistration metrology tool 104 in a single measurement. Thereafter, MARSE 132 generates misregistration metrology data associated with each ROI 122, 124, 126 and 128 included in set of ROIs 106 contained within measurement site 108 measured at step 212. Thus, a plurality of misregistration measurement data sets for measurement site 108 associated with set of ROIs 106 is generated. While step 212 preferably includes measuring the entirety of measurement site 108 a single time, step 212 may include measuring the entirety of measurement site 108 multiple times. Advantageously, step 212 generates a plurality of misregistration measurement data sets associated with set of ROIs 106 in a single measurement.

In an alternative embodiment of step 210, as seen at step 214, misregistration metrology tool 104 measures misregistration of various sections of measurement site 108. Preferably, each of the sections measured at step 214 contains one or more of ROIs 122, 124, 126 and 128. Thereafter, MARSE 132 generates misregistration metrology data associated with each ROI 122, 124, 126 and 128 included in the sections measured in step 214. Thus, a plurality of misregistration measurement data sets associated with set of ROIs 106 is generated. Advantageously, step 214 generates a plurality of misregistration measurement data sets associated with set of ROIs 106 in fewer measurements than the number of ROIs in set of ROIs 106.

As seen at step 216, in yet another alternative embodiment of step 210, misregistration metrology tool 104 measures misregistration of each ROI 122, 124, 126 and 128 in set of ROIs 106 separately. In one embodiment of the present invention, for each ROI 122, 124, 126 and 128, step 216 is repeated multiple times, thereby generating misregistration measurement data sets that include quality metrics indicating a sensitivity of misregistration measurement data to ROI placement. The quality metrics indicating a sensitivity of misregistration measurement data to ROI placement provide information on the precision of misregistration measurement data associated with each of ROIs 122, 124, 126 and 128. Thus, a plurality of misregistration measurement data sets associated with set of ROIs 106 is generated. Advantageously, step 216 generates a generally highly repeatable plurality of misregistration measurement data sets associated with set of ROIs 106.

As seen at step 218, a determination is made whether or not to use an additional misregistration metrology tool 104 of set of misregistration metrology tools 102 to generate misregistration measurement data associated with at least one ROI of set of ROIs 106. If an additional misregistration metrology tool 104 is to be used, RSM 200 returns to step 210, and an additional misregistration metrology tool 104 of set of misregistration metrology tools 102 generates misregistration measurement data associated with at least one ROI of set of ROIs 106. Typically, if multiple misregistration metrology tools 104 are used in step 210, an especially well-suited ROI can be identified by MMRSS 100. If an additional misregistration metrology tool 104 is not to be used, RSM 200 proceeds to a next step 220. It is appreciated that the number of times to repeat step 210 with an additional misregistration metrology tool 104 is typically determined by an operator, since the run-time of RSM 200 is a function of the number of misregistration metrology tools 104 for which step 210 is performed.

At step 220, MARSE 132 analyzes the plurality of misregistration measurement data sets associated with set of ROIs 106 generated by at least one misregistration metrology tool 104 in step 210. As part of step 220, MARSE 132 evaluates a set of quality metrics associated with the misregistration measurement data sets generated at step 210. The set of quality metrics may include, inter alia, accuracy flags, TIS, Qmerit, focus sensitivity, throughput, precision and sensitivity to ROI placement. The sensitivity to ROI placement quality metric provides an indication of how misregistration measurement data and quality metrics of misregistration change for different ones of ROIs 122, 124, 126 and 128 of set of ROIs 106.

If misregistration metrology tool 104 is embodied as an imaging or electron beam misregistration metrology tool, the set of quality metrics may also include, for example, contrast precision. If misregistration metrology tool 104 is embodied as a scatterometry misregistration metrology tool, the set of quality metrics may also include, for example, pupil 3σ and any additional suitable pupil data quality metrics.

At a next step 230, MARSE 132 determines if at least one ROI 122, 124, 126 or 128 is associated with a misregistration data set having quality metrics within a predetermined tolerance. If none of ROIs 122, 124, 126 or 128 are associated with a misregistration data set having quality metrics within the predetermined tolerance, then RSM 200 ends at a next step 232 and provides an output indicating that no recommended ROI was found.

If at least one ROI 122, 124, 126 or 128 is associated with a misregistration data set having quality metrics within the predetermined tolerance, RSM 200 proceeds to step 240 and MARSE 132 identifies one or more recommended ROIs. As part of step 240, the quality metrics from step 220 of each misregistration measurement data set are compared to each other, and at least one ROI 122, 124, 126 or 128 associated with a misregistration data set associated with the most desirable set of quality metrics is identified as the at least one recommended ROI. Preferably, in an embodiment of the present invention that includes step 216, at step 240 MARSE 132 particularly considers the sensitivity to ROI placement quality metric.

Preferably, at a next step 250, MARSE 132 communicates the at least one recommended ROI identified in step 240 to misregistration metrology tool 104 that generated the misregistration measurement data at step 210. Also at step 250, MARSE 132 preferably communicates the at least one recommended ROI to at least one additional misregistration metrology tool 104 of set of misregistration metrology tools 102 other than misregistration metrology tool 104 that generated misregistration measurement data sets associated with set of ROIs 106 in step 210.

At a next step 260, a misregistration metrology tool 104 of set of misregistration metrology tools 102 other than misregistration metrology tool 104 used at step 210 measures misregistration between at least two layers of wafer 112 using at least one recommended ROI, selected from the one or more recommended ROI identified at step 240. It is appreciated that wafer 112 measured at step 260 may be the same wafer 112 as wafer 112 measured at step 210 or may be a different wafer 112 selected from batch of wafers 120.

In some embodiments of the present invention, MMRSS 100 and RSM 200 may be included in a set of automatic recipe optimization (ARO) protocols, a set of standalone optimization protocols or a set of automatic recipe training protocols, similar to protocols described in U.S. patent application Ser. No. 16/747,734, filed Jan. 21, 2020 and entitled SYSTEM AND METHOD FOR ANALYZING A SAMPLE WITH A DYNAMIC RECIPE BASED ON ITERATIVE EXPERIMENTATION AND FEEDBACK.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A misregistration measurement and region of interest selection system (MMRSS) for measuring misregistration between at least two layers formed on a wafer in the manufacture of semiconductor devices, the MMRSS comprising:
  a set of misregistration metrology tools, comprising at least two misregistration metrology tools; and
  a misregistration analysis and region of interest selection engine (MARSE) operative to:
    analyze a plurality of misregistration measurement data sets associated with a set of regions of interest (ROIs) of at least one measurement site on said wafer and at least partially generated by at least one first misregistration metrology tool of said at least two misregistration metrology tools, said set of ROIs comprising at least two ROIs, and wherein each of said misregistration measurement data sets associated with said set of ROIs is associated with a set of quality metrics;
    identify a recommended region of interest (ROI) from said set of ROIs, wherein said recommended ROI is an area that is at least a portion of said measurement site; and
    communicate said recommended ROI to at least one second misregistration metrology tool of said at least two misregistration metrology tools, said at least one second misregistration metrology tool and said at least one first misregistration metrology tool being separate tools and said at least one second misregistration metrology tool being operative to generate misregistration metrology data associated with said recommended ROI.

2. The MMRSS according to claim 1 and wherein said at least two misregistration metrology tools are both imaging misregistration metrology tools, are both electron beam misregistration metrology tools, or are both scatterometry misregistration metrology tools.

3. The MMRSS according to claim 1 and wherein said set of quality metrics comprise at least one of:
  accuracy flags;

a tool induced shift (TIS);
a Qmerit;
a focus sensitivity;
a throughput;
a precision;
a sensitivity to ROI placement;
a contrast precision; and
a pupil 3σ.

4. The MMRSS according to claim 1 and wherein said recommended ROI is identified based on said set of quality metrics.

5. The MMRSS according to claim 1 and wherein said at least one first misregistration metrology tool comprises a single misregistration metrology tool of said set of misregistration metrology tools.

6. The MMRSS according to claim 1 and wherein said at least one first misregistration metrology tool comprises multiple misregistration metrology tools of said set of misregistration metrology tools.

7. The MMRSS according to claim 1 and wherein said set of ROIs comprises 100 ROIs.

8. The MMRSS according to claim 1 and wherein said ROIs are measured separately by said at least one first misregistration metrology tool.

9. The MMRSS according to claim 8 and wherein said set of ROIs is measured multiple times by said at least one first misregistration metrology tool.

10. The MMRSS according to claim 1 and wherein said ROIs in said set of ROIs are measured by each of said at least one first misregistration metrology tools in a single measurement, and wherein said MARSE is operative to identify said plurality of misregistration measurement data sets from data generated by said single measurement.

11. The MMRSS according to claim 1 and wherein said MARSE is further operative to communicate said recommended ROI to said at least one first misregistration metrology tool.

12. The MMRSS according to claim 1 and wherein said MMRSS is operative to be used in at least one of:
a set of automatic recipe optimization (ARO) protocols;
a set of standalone optimization protocols; and
a set of automatic recipe training protocols.

13. A region of interest selection method (RSM) for measuring misregistration between at least two layers formed on a wafer in the manufacture of semiconductor devices, the RSM comprising:
generating a plurality of misregistration measurement data sets associated with a set of regions of interest (ROIs) of at least one measurement site on said wafer using at least one first misregistration metrology tool of a set of misregistration metrology tools, said set of ROIs comprising at least two ROIs, and wherein each of said misregistration measurement data sets associated with said set of ROIs is associated with a set of quality metrics;
identifying a recommended region of interest (ROI) from said set of ROIs, wherein said recommended ROI is an area that is at least a portion of said measurement site;
communicating said recommended ROI to at least one second misregistration metrology tool of said set of misregistration metrology tools, said at least one second misregistration metrology tool and said at least one first misregistration metrology tool being separate tools; and
generating misregistration metrology data associated with said recommended ROI using said at least one second misregistration metrology tool.

14. The RSM according to claim 13 and wherein said first misregistration metrology tool and said second misregistration metrology tool are both imaging misregistration metrology tools, are both electron beam misregistration metrology tools, or are both scatterometry misregistration metrology tools.

15. The RSM according to claim 13 and wherein said set of quality metrics comprise at least one of:
accuracy flags;
a tool induced shift (TIS);
a Qmerit;
a focus sensitivity;
a throughput;
a precision;
a sensitivity to ROI placement;
a contrast precision; and
a pupil 3σ.

16. The RSM according to claim 13 and wherein said recommended ROI is identified based on said set of quality metrics.

17. The RSM according to claim 13 and wherein said at least one first misregistration metrology tool comprises a single misregistration metrology tool of said set of misregistration metrology tools.

18. The RSM according to claim 13 and wherein said at least one first misregistration metrology tool comprises multiple misregistration metrology tools of said set of misregistration metrology tools.

19. The RSM according to claim 13 and wherein said set of ROIs comprises 100 ROIs.

20. The RSM according to claim 13 and wherein said ROIs are measured separately by said at least one first misregistration metrology tool.

21. The RSM according to claim 20 and wherein said set of ROIs is measured multiple times by said at least one first misregistration metrology tool.

22. The RSM according to claim 13 and wherein said ROIs in said set of ROIs are measured by each of said at least one first misregistration metrology tools in a single measurement, and wherein the RSM further comprises identifying said plurality of misregistration measurement data sets from data generated by said single measurement.

23. The RSM according to claim 13 and also comprising communicating said recommended ROI to said at least one first misregistration metrology tool.

24. The RSM according to claim 13 and wherein said RSM is used as part of at least one of:
a set of automatic recipe optimization (ARO) protocols;
a set of standalone optimization protocols; and
a set of automatic recipe training protocols.

* * * * *